(12) United States Patent
Skrobis (10) Patent No.: US 9,469,040 B2
(45) Date of Patent: Oct. 18, 2016

(54) RAZOR BLADE COATING

(75) Inventor: Kenneth James Skrobis, Maynard, MA (US)

(73) Assignee: The Gillette Company, Boston, MA (US)

(*) Notice: Subject to any disclaimer, the term of this patent is extended or adjusted under 35 U.S.C. 154(b) by 1648 days.

(21) Appl. No.: 12/779,354

(22) Filed: May 13, 2010

(65) Prior Publication Data

US 2010/0287781 A1 Nov. 18, 2010

Related U.S. Application Data

(60) Provisional application No. 61/178,515, filed on May 15, 2009.

(51) Int. Cl.
*B26B 21/58* (2006.01)
*B26B 21/60* (2006.01)
*C23C 28/00* (2006.01)

(52) U.S. Cl.
CPC .............. *B26B 21/60* (2013.01); *C23C 28/00* (2013.01); *C23C 28/321* (2013.01); *C23C 28/322* (2013.01); *C23C 28/34* (2013.01); *C23C 28/341* (2013.01); *C23C 28/343* (2013.01); *C23C 28/345* (2013.01); *C23C 28/3455* (2013.01)

(58) Field of Classification Search
CPC ..... B26B 21/60; C23C 28/00; C23C 28/321; C23C 28/322; C23C 28/34; C23C 28/341; C23C 28/343; C23C 28/345; C23C 28/3455
USPC .......................... 30/50, 346.53, 346.54, 350
See application file for complete search history.

(56) References Cited

U.S. PATENT DOCUMENTS

| | | | | |
|---|---|---|---|---|
| 3,518,110 | A * | 6/1970 | Fischbein | 428/335 |
| 4,933,058 | A * | 6/1990 | Bache et al. | 204/192.3 |
| 5,032,243 | A * | 7/1991 | Bache et al. | 204/192.34 |
| 5,142,785 | A * | 9/1992 | Grewal et al. | 30/32 |
| 5,217,010 | A * | 6/1993 | Tsitlik et al. | 607/9 |
| 5,232,568 | A * | 8/1993 | Parent et al. | 204/192.3 |
| 5,263,256 | A * | 11/1993 | Trankiem | 30/346.54 |
| 5,295,305 | A * | 3/1994 | Hahn et al. | 30/50 |
| 5,497,550 | A * | 3/1996 | Trotta et al. | 30/50 |
| 5,669,144 | A * | 9/1997 | Hahn et al. | 30/346.54 |
| 5,940,975 | A * | 8/1999 | Decker et al. | 30/346.54 |
| 5,985,459 | A * | 11/1999 | Kwiecien et al. | 428/421 |
| 6,684,513 | B1 * | 2/2004 | Clipstone et al. | 30/346.54 |
| 7,060,367 | B2 * | 6/2006 | Yamada et al. | 428/634 |
| 7,966,909 | B2 * | 6/2011 | Madeira et al. | 76/104.1 |
| 2006/0201001 | A1 * | 9/2006 | Teeuw et al. | 30/346.54 |
| 2006/0277767 | A1 | 12/2006 | Sun et al. | |

* cited by examiner

*Primary Examiner* — Hwei C Payer
(74) *Attorney, Agent, or Firm* — Joanne N. Pappas; Kevin C. Johnson; Steven W. Miller

(57) ABSTRACT

A razor blade that includes a substrate with a cutting edge, the substrate includes (a) a thin-film of a first material disposed thereon, the thin-film having a thickness less than 1 μm; (b) a mixed nitride-thin-film interregion disposed at or adjacent a surface of the thin-film and a surface of the substrate; and (c) a nitride region disposed adjacent the mixed nitride-thin-film interregion.

10 Claims, 6 Drawing Sheets

RAZOR BLADE COATING

CROSS REFERENCE TO RELATED APPLICATIONS

This application claims the benefit of U.S. provisional application No. 61/178,515, filed May 15, 2009.

FIELD OF THE INVENTION

The present invention relates to improvements for coating a razor blade.

BACKGROUND OF THE INVENTION

In order to improve the chemical and mechanical properties of a substrate, e.g., hardness, wear resistance, corrosion resistance, and fatigue resistance, plating of the substrate with a metal and thereafter forming a nitride region on the plated substrate are generally practiced. However, most of these processes produce a thick coating over the surface of the substrate and do not penetrate into the substrate. This results in a rough substrate surface as well as significant brittleness because of byproduct growth or hillocks that are formed. Utilizing these processes on a razor blade does not actually increase the strength of the razor blade, but instead produces a brittle cutting edge. If the cutting edge breaks on a razor blade, the remaining razor blade will yield an extremely uncomfortable shave.

There is a need for an improved coated razor blade and method for coating the razor blade that overcomes these shortcomings. Accordingly, the present invention advantageously allows for the type, composition, and thickness of a first material to be easily changed and controlled, which strengthens the underlying razor blade and reduces its brittleness. The methods disclosed herein will greatly reduce or eliminate the severe roughening and/or byproduct growth on the surface of the razor blade. In addition, these methods permit the nitriding to be localized in a particular area or throughout the razor blade. In turn, these methods also provide a more controlled and deeper nitriding of the razor blade, both vertically and laterally, as well as a more gradual nitriding gradient, thereby resulting in a razor blade with a smooth cutting edge that exhibits increased hardness, strength, and durability.

SUMMARY OF THE INVENTION

In an aspect, the present invention relates to a razor blade comprising a substrate with a cutting edge, the substrate comprising: (a) a thin-film of a first material disposed thereon, the thin-film having a thickness less than 1 µm; (b) a mixed nitride-thin-film interregion disposed at or adjacent a surface of the thin-film and a surface of the substrate; and (c) a nitride region disposed adjacent the mixed nitride-thin-film interregion.

In another aspect, the present invention relates to a method for coating a razor blade comprising the steps of: (a) providing a substrate comprising a cutting edge; (b) applying a thin-film of a first material on the substrate by a thin-film process, wherein the thin-film has a thickness less than 1 µm after being applied; (c) nitriding the thin-film and the substrate with a nitrogen-containing gas or plasma to form (1) a mixed nitride-thin-film interregion disposed at or adjacent a surface of the thin-film and a surface of the substrate, and (2) a nitride region disposed adjacent the mixed nitride-thin-film interregion.

Other features and advantages of the invention will be apparent from the description and drawings, and from the claims. The figures herewith are artist conceptual renditions, which are not drawn to scale, but are drawn in a way which will demonstrate the features being discussed.

DETAILED DESCRIPTION OF THE INVENTION

As used herein, the term "coating" means a covering, including a free film, an impregnation, or the like, that is applied to an object or substrate, such that the covering may be continuous, discontinuous, may have a single or varying thicknesses, or may exist in a single or multiple planes.

As used herein, the term "thin-film" refers to a coating of a material that has a thickness less than 1 µm after being applied. A thin-film may be applied to a substrate by a thin-film process. As used herein, the term "thin-film process" is descriptive of a variety of processes such as a nanocoating process, a ceramic coating process, a physical vapor deposition (PVD) process, a chemical vapor deposition (CVD) process, an ion assisted coating process, a spin coating process, a dipping process, a painting process, an epitaxy process, and the like, but not electrodeposition, electrochemical plating, electroplating, and electrochemical deposition since these latter processes produce a much thicker coating and do not allow nitride to diffuse or penetrate into a substrate upon nitriding.

FIGS. 1-6 show a razor blade (8) comprising a substrate (10) having a cutting edge (12). In an embodiment, the substrate (10) may comprise a material such as stainless steel, aluminum, titanium, or other suitable substrate materials. AISI 440 is a particularly well-suited stainless steel substrate material. The present invention is not limited to a razor blade (8). For example, the substrate (10) may take the form of a drill bit, a knife, a milling cutter, a tool bit, a surgical instrument, and the like.

Figure 1:
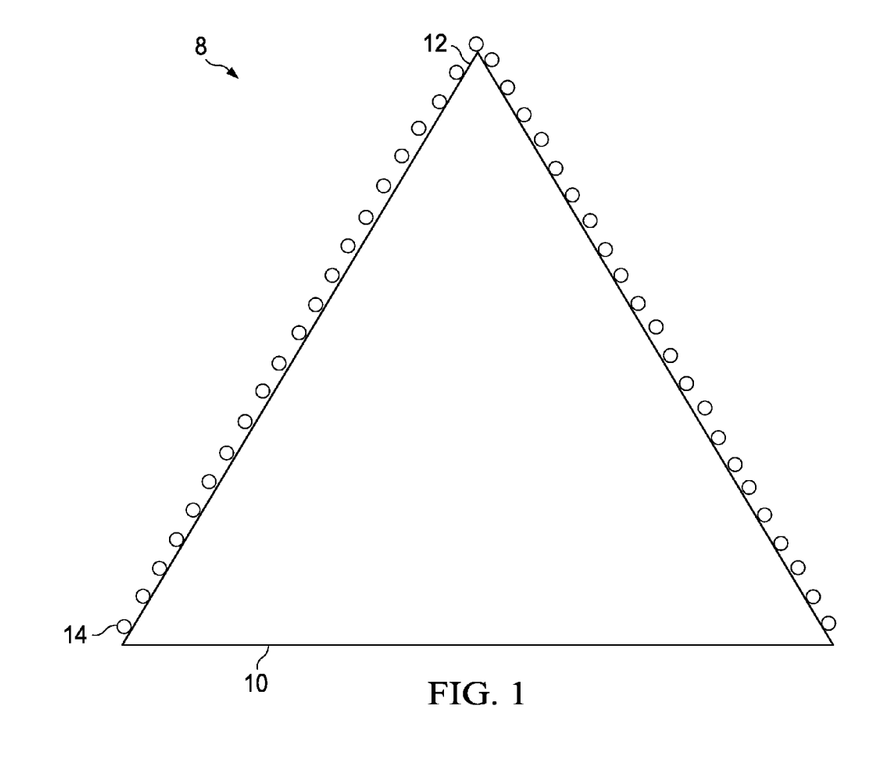
FIG. 1 is a diagrammatic view of a razor blade having a cutting edge with a thin-film of a first material applied in accordance with the present invention.

In FIG. 1, the substrate (10) comprises a thin-film of first material (14) disposed on the substrate (10), generally on the cutting edge (12), by a thin-film process such that the thin-film (14) has a thickness less than 1 µm after being applied. For example, the thin-film (14) may have a thickness from about 10, 20, 50, 75, 90, 110, 125, 140, 155, 170, 185, 195, 200, 215, 225, or 235 Angstroms to about 265, 280, 295, 310, 325, 340, 355, 370, 385, 400, 425, 450, 475, 500, 550, 600, 750, 800, 850, 900, 1000, 1200, 1500, 2000, 4000, 6000, 8000, or 9999 Angstroms. In a particular embodiment, the thin-film (14) has a thickness of about 250 Angstroms. Generally, the thinner the material turns out to be on a cutting edge (12), the lower the cutting force and the better the cutting attributes. Examples of cutting edge structures having lower cutting forces are described in U.S. Pat. Nos. 5,295,305; 5,232,568; 4,933,058; 5,032,243; 5,497,550; 5,940,975; 5,669,144; 5,217,010; and 5,142,785.

The first material may comprise a material selected from the group consisting of a metal, a metal alloy, a metal carbide, a metal oxide, a metal nitride, derivatives and combinations thereof. For example, the metal may be selected from the group consisting of Ta, Ru, Ni, V, Ti, Pt, Cr, Nb, Hf, W, Zr, Ag, Re, Pd, Fe, and combinations thereof.

The thin-film (14) may be applied by a thin-film process, as described above. For example, the thin-film (14) may be applied by sputtering using a DC bias (more negative than about −50 volts or even more negative than about −200 volts) and pressure of about 2 millitorr argon.

Figure 2:
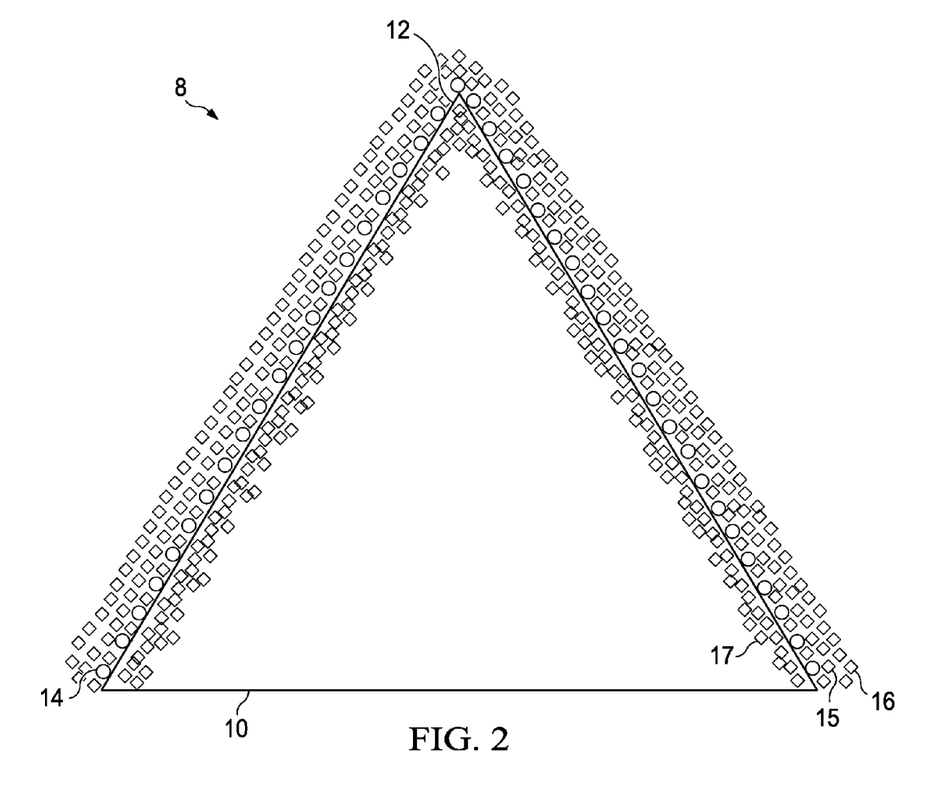
FIG. 2 is a diagrammatic view of the razor blade of FIG. 1 further including a mixed nitride-thin-film interregion, a nitride region, and a mixed nitride-substrate interregion in accordance with the present invention.

Referring to FIG. 2, the substrate (10) also comprises a mixed nitride-thin-film interregion (15) disposed at or adjacent a surface of the thin-film (14) and a surface of the substrate (10). A nitride region (16) is also disposed adjacent, e.g., above or on top of, the mixed nitride-thin-film interregion (15). Since using a thin-film process may apply a discontinuous thin-film (14), upon nitriding, a mixed nitride-substrate interregion (17) may also be formed. This mixed nitride-substrate interregion (17) provides added strength to the substrate (10) and is disposed adjacent, e.g., below, the mixed nitride-thin-film interregion (15) beneath the surface of the substrate (10). Generally, the mixed nitride-thin-film interregion (15), nitride region (16), and/or the mixed nitride-substrate interregion (17) are formed by nitriding both the thin-film (14) and the underlying substrate (10) with a nitrogen-containing gas or plasma. Other nitriding methods known in the art could also be used.

In an example, the mixed nitride-thin-film interregion (15), nitride region (16), and/or the mixed nitride-substrate interregion (17) are formed from a nitrogen-containing plasma, i.e., plasma nitriding. Plasma nitriding is an advanced surface hardening process that utilizes nitrogen atoms and/or ions. According to this process, which is conducted in a process chamber containing nitrogen gas, a strong electrostatic field is established between the thin-film (14), the substrate (10), generally near the cutting edge (12), and an electrode. As a result of the electrostatic field, the nitrogen gas is atomized and/or ionized, which causes the nitrogen atoms and/or ions to accelerate toward and contact the thin-film (14) and/or the substrate (10) to form the mixed nitride-thin-film interregion (15) and/or nitride region (16). The nitrogen atoms and/or ions may also penetrate or diffuse directly (16) or indirectly through the thin-film (14) beneath the surface of the substrate (10), or both to form mixed nitride-substrate interregion (17), as shown in FIG. 2.

Figure 3:
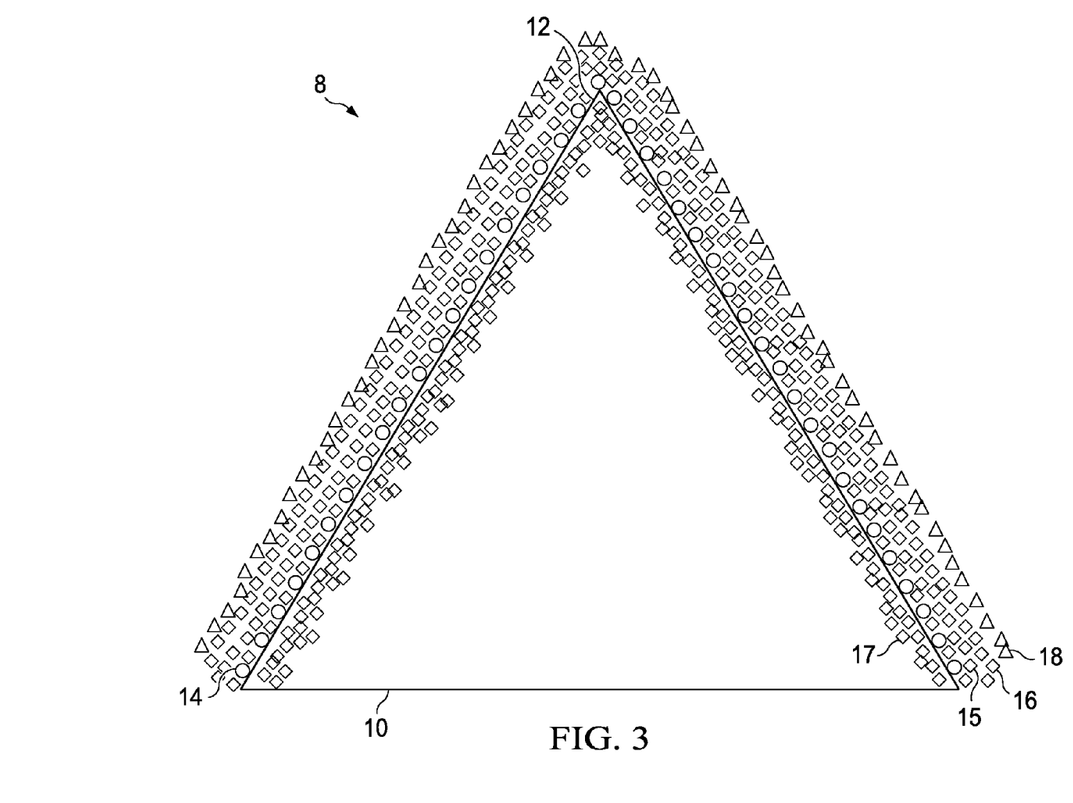
FIG. 3 is a diagrammatic view of the razor blade of FIG. 2 further including a second material in accordance with the present invention.

Referring to FIG. 3, a coating of a second material (18) may be disposed over the mixed nitride-thin-film interregion (15), the nitride region (16), or both. The second material coating (18) generally provides improved strength and corrosion resistance. The second material coating (18) also improves shaving ability as well as reduces rounding of the tip of the cutting edge (12). The second material may comprise a material selected from the group consisting of a metal, a metal alloy, a metal carbide, a metal oxide, a metal nitride, diamond, amorphous diamond, diamond-like carbon, boron, boron nitride, derivatives and combinations thereof. For example, the metal may be selected from the group consisting of Ta, Ru, Ni, V, Ti, Pt, Cr, Nb, Hf, W, Zr, Ag, Re, Pd, Fe, and combinations thereof.

As described in the "Handbook of Physical Vapor Deposition (PVD)," DLC is an amorphous carbon material that exhibits many of the desirable properties of diamond but does not have the crystalline structure of diamond. Examples of suitable materials such as niobium and chromium containing materials, pure or doped carbon containing materials (e.g., diamond, amorphous diamond or DLC), nitrides (e.g., boron nitride, niobium nitride or titanium nitride), carbides (e.g., silicon carbide), oxides (e.g., alumina, zirconia) or other ceramic materials, for the second material are described in U.S. Pat. Nos. 5,295,305 and 6,684,513. U.S. Pat. No. 5,232,568 also describes suitable DLC layers and methods of depositing those layers.

Similar to the thin-film (14), the second material coating (18) may be applied by sputtering using a DC bias (more negative than about −50 volts or even more negative than about −200 volts) and pressure of about 2 millitorr argon. Without being limited by theory, the increased negative bias promotes a compressive stress (as opposed to a tensile stress), in the second material coating (18).

Alternatively, the thin-film (14) and/or the second material coating (18) may be applied by generating ions from their respective material by applying a negative voltage to the material in pulses, as described in U.S. patent application Ser. No. 11/881,288, now U.S. Pat. No. 7,966,909, which is commonly owned and assigned to The Gillette Company. In an embodiment, the second material coating (18) may comprise chromium and be between about 100 and about 700 Angstroms thick. For example, the second material coating (18) may have a thickness from about 100, 125, 150, 175, 200, 225, 250, or 275 Angstroms to about 325, 350, 375, 400, 450, 500, 550, 600, 650, or 700 Angstroms. In a particular embodiment, the second material coating (18) has a thickness of about 300 Angstroms.

In an embodiment, the cutting edge (12) comprises a wedge-shaped tip that has an included angle of less than thirty degrees and a tip radius of less than about 1,000 Angstroms. Generally, the tip radius may be between about 200 and about 500 Angstroms, measured by SEM, after application of the second material coating (18). For example, the tip radius may be between about 100, 125, 150, 175, 200, 225, 240, 250, 265, 275, 290 Angstroms to about 310, 325, 340, 355, 375, 400, 450, 500 Angstroms. In a particular embodiment, the tip radius is about 300 Angstroms.

Figure 4:
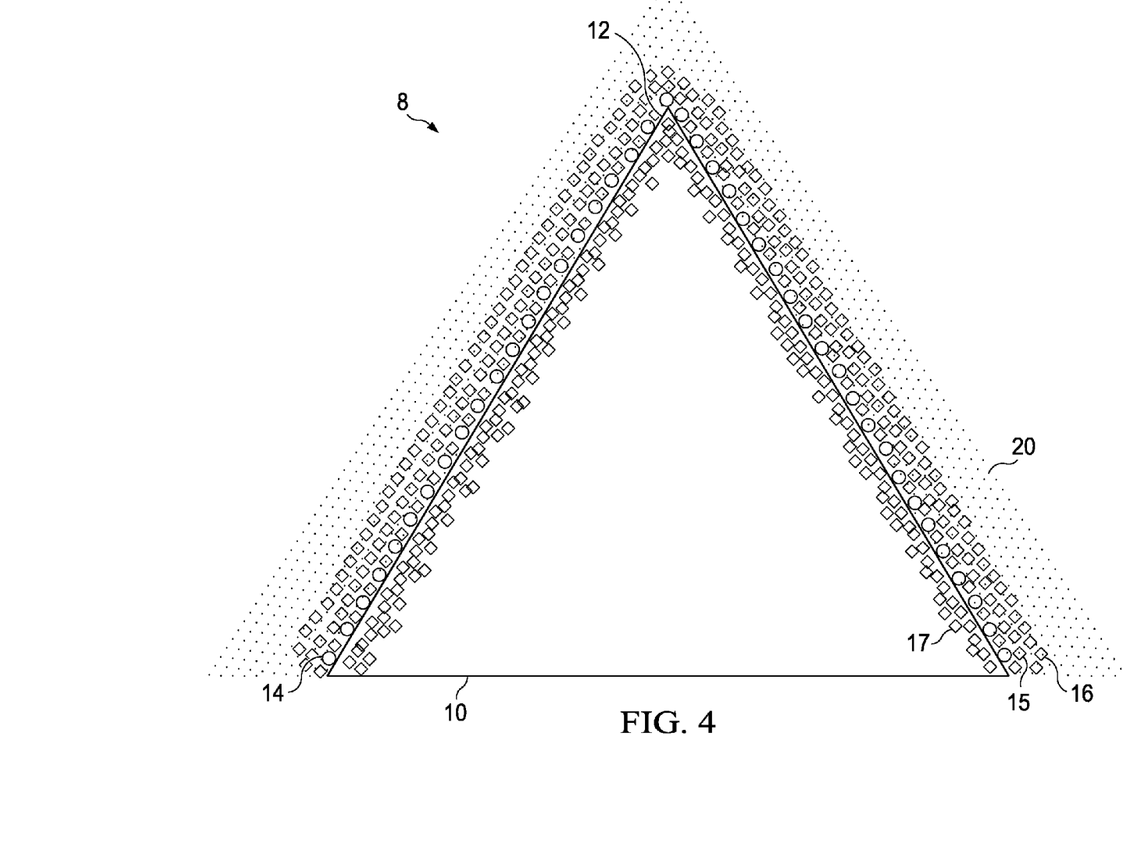
FIG. 4 is a diagrammatic view of the razor blade of FIG. 2 further including a fluoropolymer-containing coating in accordance with the present invention.
Figure 5:
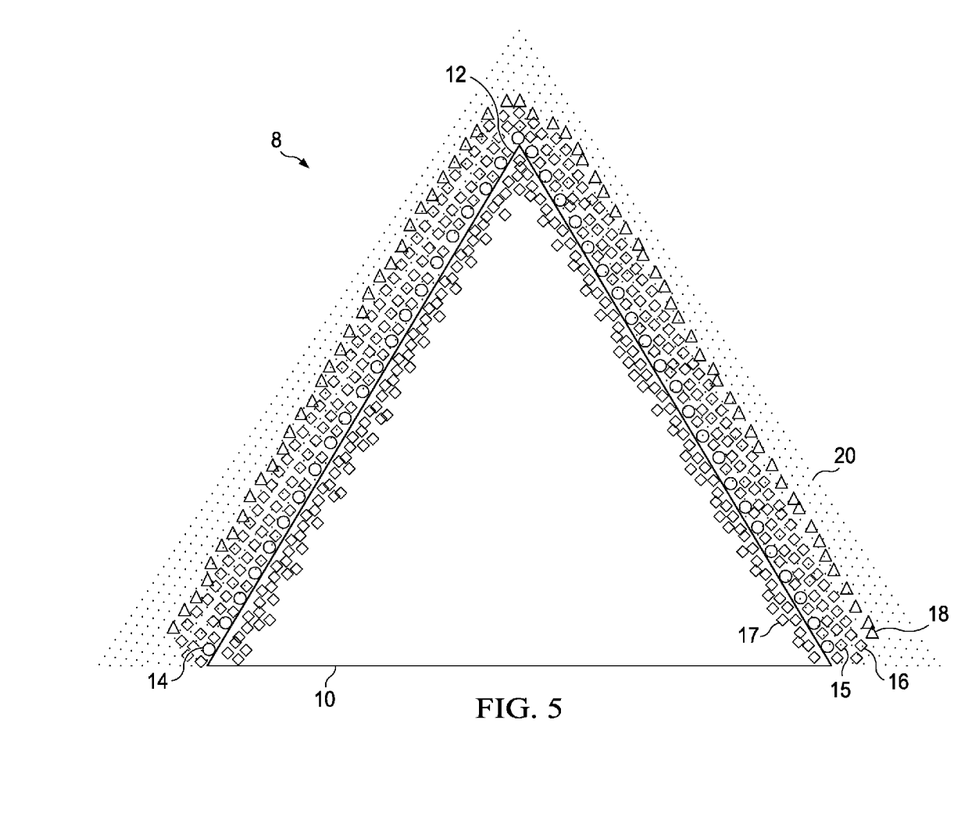
FIG. 5 is a diagrammatic view of the razor blade of FIG. 3 further including a fluoropolymer-containing coating in accordance with the present invention.

As shown in FIG. 4, a fluoropolymer-containing coating (20) may be applied directly over the mixed nitride-thin-film interregion (15), the nitride region (16), or both. In general, the fluoropolymer-containing coating (20) reduces friction at its surface and comprises polytetrafluoroethylene (PTFE), otherwise known as a telomer. It is known that when a generally continuous telomer coating is applied, a reduced telomer coating thickness can provide improved first shave results. Alternatively, the fluoropolymer-containing coating (20) may be applied over the second material coating (18), as shown in FIG. 5. In general, the second material coating (18) facilitates the bonding of the fluoropolymer-containing coating (20) to the substrate (10).

Krytox® LW 1200, which is available from DuPont, is a suitable fluoropolymer-containing material, i.e., a PTFE, which may be used as the fluoropolymer-containing coating (20). Krytox® LW 1200 is a nonflammable and stable dry lubricant that consists of small particles that yield stable dispersions. It is furnished as an aqueous dispersion of 20% solids by weight and can be applied by dipping, spraying, or brushing, and can thereafter be air dried or melt coated. For example, the fluoropolymer-containing coating (20) may be formed by heating the substrate (10) in a neutral atmosphere of argon and providing an adherent and friction-reducing polymer coating of solid PTFE, as described in U.S. Pat. Nos. 5,295,305 and 3,518,110. Utilizing the technique described in the aforementioned patents results in the fluoropolymer-containing coating (20) generally having a thickness from about 1000, 1100, 1200, 1300, 1400, 1500, 1600, 1700, 1750, 1800, 1850, 1900, 1950, or 1975 Angstroms to about 2025, 2050, 2100, 2150, 2200, 2600, 3000 or 5000 Angstroms. In a particular embodiment, the fluoropolymer-containing coating (20) has a thickness of about 2000 Angstroms. Alternatively, U.S. Pat. Nos. 5,263,256 and 5,985,459 describe other techniques which may be used to reduce the thickness of an applied telomer layer. Utilizing these other techniques, the fluoropolymer-containing coating (20) may have a thickness from about 100, 120, 140, 150, 165, 175, 185, or 190 Angstroms to about 210, 225, 250, 275, 300, 350, 400, 500, 600, 800, 1000, 1200, or 1500 Angstroms. In a particular embodiment, the fluoropolymer-containing coating (20) has a thickness of about 200 Angstroms.

The present invention also relates to a method for coating a razor blade comprising the steps of: (a) providing a substrate comprising a cutting edge; (b) applying a thin-film of a first material on the substrate by a thin-film process, wherein the thin-film has a thickness less than 1 μm after being applied; (c) nitriding the thin-film and the substrate with a nitrogen-containing gas or plasma to form (1) a mixed nitride-thin-film interregion disposed at or adjacent a surface of the thin-film and a surface of the substrate, and (2) a nitride region disposed adjacent the mixed nitride-thin-film interregion.

The substrate may comprise a material such as stainless steel, aluminum, titanium, or other suitable substrate materials. AISI 440 is a particularly well-suited stainless steel substrate material. In an embodiment, the cutting edge may comprise a wedge-shaped tip that has an included angle of less than thirty degrees and a tip radius of less than about 1,000 Angstroms, such as those depicted in FIGS. 1-5. For example, the tip radius may be about 100, 125, 150, 175, 200, 225, 240, 250, 265, 275, or 290 Angstroms to about 310, 325, 340, 355, 375, 400, 450, 500, 600, 700, 800, 900, or 999 Angstroms. In a particular embodiment, the tip radius is about 300 Angstroms.

The thin-film may be applied by a thin-film process, as described above. The thin-film may have a thickness from about 10, 20, 50, 100, 150, 170, 180, 190, 200, 210, 220, 230, or 240 Angstroms to about 260, 270, 280, 290, 300, 325, 350, 400, 500, 600, 800, 1000, 1500, 2000, 3000, 4000, 5000, or 8000 Angstroms. In a particular embodiment, the thin-film has a thickness of about 250 Angstroms. The first material may comprise a material selected from the group consisting of a metal, a metal alloy, a metal carbide, a metal oxide, a metal nitride, derivatives and combinations thereof. For example, the metal for the first material may be selected from the group consisting of Ta, Ru, Ni, V, Ti, Pt, Cr, Nb, Hf, W, Zr, Ag, Re, Pd, Fe, and combinations thereof.

To provide added strength, during step (c), the nitrogen atoms and/or ions may also penetrate or diffuse into the underlying substrate directly and/or indirectly beneath the surface of the underlying substrate, as previously described, to the form a mixed nitride-substrate interregion. A coating of a second material may also be applied over the nitride-thin-film interregion, the nitride region, or both. The second material may comprise a material selected from the group consisting of a metal, a metal alloy, a metal carbide, a metal oxide, a metal nitride, diamond, amorphous diamond, diamond-like carbon, boron, boron nitride, derivatives and combinations thereof. For example, the metal may be selected from the group consisting of Ta, Ru, Ni, V, Ti, Pt, Cr, Nb, Hf, W, Zr, Ag, Re, Pd, Fe, and combinations thereof. A fluoropolymer-containing coating, as described above, may further be applied over the second material or, in the absence of the second material, directly over the over nitride-thin-film interregion, the nitride region, or both.

Figure 6:
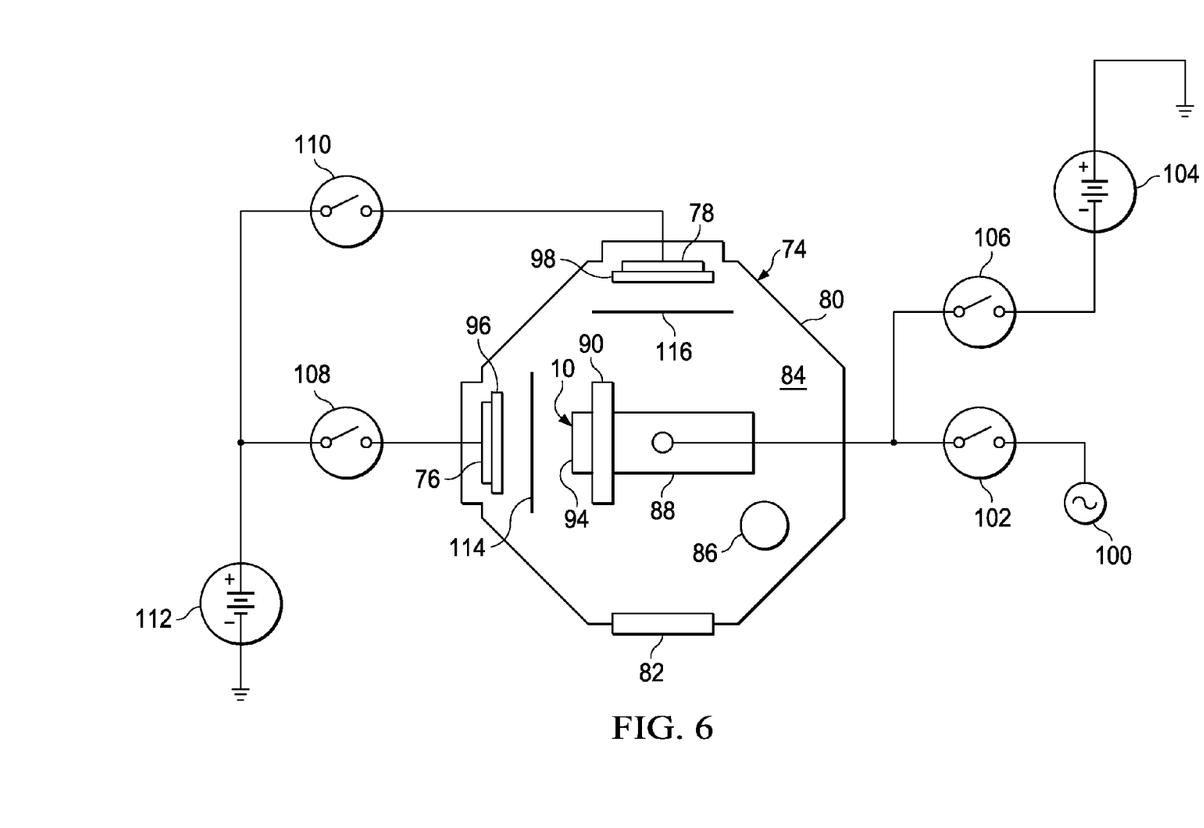
FIG. 6 is a diagrammatic view of an exemplary apparatus for applying the first material, second material, and/or the fluoropolymer-containing coating in accordance with the present invention.

FIG. 6 shows an exemplary apparatus for applying the thin-film (14), second material (18), and/or the fluoropolymer-containing coating (20), as shown in FIGS. 1-5. The apparatus includes a DC planar magnetron sputtering system manufactured by Vac Tec Systems of Boulder, Colo. that has a stainless steel chamber (74) with a wall structure (80), a door (82) and a base structure (84) in which is formed a port (86) coupled to a suitable vacuum system (not shown). Mounted in the chamber (74) is a carousel support (88) with an upstanding support member (90) on which a stack of substrates (10) may be disposed, typically having their cutting edges (12) in alignment and facing outwardly from the support member (90).

Also disposed in the chamber (74) is a support structure (76) for a target (96), e.g., first material, second material, and/or fluoropolymer-containing material, respectively. An additional support structure (78) for another target (98) may also be disposed in the chamber (74). The targets (96, 98) are vertically disposed plates, each about twelve centimeters wide and about thirty-seven centimeters long. The support structures (76, 78 and 88) are electrically isolated from the chamber (74) and electrical connections are provided to connect the substrate (10) to a RF power supply (100) through a switch (102) and to a DC power supply (104) through a switch (106). The targets (96, 98) are also connected through switches (108, 110), respectively, to a DC magnetron power supply (112). A shutter structure (114, 116) is disposed adjacent targets (96, 98), respectively, for movement between an open position and a position obscuring the adjacent target.

A carousel (88) may support the substrate (10) and may be spaced about seven centimeters from the opposed target plate (96, 98). The carousel (88) is rotatable about a vertical axis between a first position in which substrate (10) may be in opposed alignment with the target (96), shown in FIG. 4, and a second position in which the substrate (10) may be in opposed alignment with the other target (98).

In an exemplary processing sequence, the substrate (10) is secured on support (90), the chamber (74) is evacuated and the targets (96, 98) are cleaned by DC sputtering for five minutes. The switch (102) is then closed and the substrate (10) is RF cleaned in an argon environment for five minutes at a pressure of ten millitorr, an argon flow of 200 sccm (standard cubic centimeters per minute) and a power of 1.5 kilowatts. The argon flow is then reduced to 150 sccm at a pressure of 2.0 millitorr in the chamber (74). The switch (106) is closed to apply a DC bias of −25 volts on substrate (10) and the switch (108) is closed to commence sputtering at one kilowatt power. The shutter (114) in front of the target (96) is opened for thirty seconds to deposit the respective material on the substrate (10).

The pressure in chamber (74) may be additionally maintained at two millitorr with an argon flow of 150 sccm. The switch (110) is closed to sputter the other target (98) material at 750 watts while switch (102) is closed to apply a 13.56 MHz RF bias of eight hundred watts (−420 volts DC self bias voltage) on substrate (10). In an example, the shutter (116) may also be opened for twenty minutes to deposit a second material (18) of about 2,000 Angstroms thickness on the mixed nitride-thin-film interregion (15), the nitride region (16), or both. Furthermore, a fluoropolymer-containing coating (20) may then be applied over the second material coating (18) by heating the substrate (10) in a neutral atmosphere of argon and applying the fluoropolymer-containing material.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A razor blade comprising a substrate with a cutting edge, the substrate comprising:

a. a thin-film of a first material disposed thereon, the thin-film having a thickness less than 1 μm;
    b. a mixed nitride-thin-film interregion disposed at and adjacent a surface of the thin-film and a surface of the substrate; and
    c. a nitride region disposed adjacent the mixed nitride-thin-film interregion.

2. The razor blade of claim 1 wherein the substrate further comprises a mixed nitride-substrate interregion disposed adjacent the mixed nitride-thin-film interregion beneath the surface of the substrate.

3. The razor blade of claim 1 wherein the first material comprises a material selected from the group consisting of a metal, a metal alloy, a metal carbide, a metal oxide, a metal nitride, derivatives and combinations thereof.

4. The razor blade of claim 3 wherein the metal is selected from the group consisting of Ta, Ru, Ni, V, Ti, Pt, Cr, Nb, Hf, W, Zr, Ag, Re, Pd, Fe, and combinations thereof.

5. The razor blade of claim 1 further comprising a coating of a second material disposed over the nitride-thin-film interregion, the nitride region, or both.

6. The razor blade of claim 5, wherein the second material comprises a material selected from the group consisting of a metal, a metal alloy, a metal carbide, a metal oxide, a metal nitride, diamond, amorphous diamond, diamond-like carbon, boron, boron nitride, derivatives and combinations thereof.

7. The razor blade of claim 6 wherein the metal is selected from the group consisting of Ta, Ru, Ni, V, Ti, Pt, Cr, Nb, Hf, W, Zr, Ag, Re, Pd, Fe, and combinations thereof.

8. The razor blade of claim 5 further comprising a fluoropolymer-containing coating over the second material.

9. The razor blade of claim 1 further comprising a fluoropolymer-containing coating over the mixed nitride-thin-film interregion, the nitride region, or both.

10. The razor blade of claim 1 wherein the cutting edge comprises a wedge-shaped tip that has an included angle of less than thirty degrees and a tip radius of less than about 1,000 Angstroms.

* * * * *